United States Patent [19]

Dawson et al.

[11] Patent Number: 5,055,890
[45] Date of Patent: Oct. 8, 1991

[54] NONVOLATILE SEMICONDUCTOR MEMORY HAVING THREE DIMENSION CHARGE CONFINEMENT

[75] Inventors: L. Ralph Dawson; Gordon C. Osbourn; Paul S. Peercy; Harry T. Weaver; Thomas E. Zipperian, all of Albuquerque, N. Mex.

[73] Assignee: The United States of America as represented by the United States Department of Energy, Washington, D.C.

[21] Appl. No.: 469,995

[22] Filed: Jan. 25, 1990

[51] Int. Cl.$^5$ .................. H01L 29/161; H01L 29/80; H01L 29/34
[52] U.S. Cl. ........................ 357/16; 357/22; 357/47; 357/41; 357/52; 357/55
[58] Field of Search ................ 357/22 A, 22 MD, 16, 357/17, 23.2, 52, 55, 41, 47, 49

[56] References Cited

U.S. PATENT DOCUMENTS

| | | | |
|---|---|---|---|
| 4,683,484 | 7/1987 | Derkits, Jr. | 357/15 |
| 4,727,403 | 2/1988 | Hida et al. | 357/22 A |
| 4,748,484 | 5/1988 | Takakuwa et al. | 357/22 A |
| 4,905,063 | 2/1990 | Beltram et al. | 357/4 |

FOREIGN PATENT DOCUMENTS

| | | | |
|---|---|---|---|
| 0171531 | 2/1986 | European Pat. Off. | 357/22 A |
| 63-229761 | 9/1988 | Japan | 357/22 A |
| 8808617 | 11/1988 | PCT Int'l Appl. | 357/22 A |

OTHER PUBLICATIONS

S. Sze, *Physics of Semiconductor Devices*, 2nd Ed., John Wiley & Sons, 1981, pp. 496-507.
F. Capasso et al., "New Floating-Gate AlGaAs/GaAs Memory Devices with Graded-Gap Electron Injector and Long Retention Times", *IEEE Electron Device Letters*, vol. 9, No. 8, Aug. 1988, pp. 377-379.
J. Cooper, Jr. et al., "Capacitance-Voltage and Current-Voltage Characteristics of Molecular Beam Epitaxially Grown p+-GaAs/AlAs/n-GaAs HeteroStructures", *Applied Physics Letters*, vol. 48, No. 5, Feb. 3, 1986, pp. 365-366.
J. Cooper, Jr. et al., "Evidence of Long-Term Storage of Minority Carriers In N+-GaAs/AlGaAs/P-GaAs MIS Capacitors", *IEEE Electron Device Letters*, vol. EDL-7, No. 6, Jun. 1986, pp. 374-376.
M. Melloch et al., "Effect of a Buried Superlattice on the Dynamic Storage of Electrons at the AlGaAs/GaAs Heterojunction", *Applied Physics Letters*, vol. 50, No. 23, Jun. 8, 1987, pp. 1657-1658.
D. Delagebeaudeuf et al., "Metal-(n) AlGaAs-GaAs Two-Dimensional Electron Gas FET", *IEEE Transactions On Electron Devices*, vol. ED-29, No. 6, Jun. 1982, pp. 955-960.

*Primary Examiner*—Andrew J. James
*Assistant Examiner*—Ngan Van Ngo
*Attorney, Agent, or Firm*—Karla Ojanen; James H. Chafin; William R. Moser

[57] ABSTRACT

A layered semiconductor device with a nonvolatile three dimensional memory comprises a storage channel which stores charge carriers. Charge carriers flow laterally through the storage channel from a source to a drain. Isolation material, either a Schottky barrier or a heterojunction, located in a trench of an upper layer controllably retains the charge within the a storage portion determined by the confining means. The charge is retained for a time determined by the isolation materials' nonvolatile characteristics or until a change of voltage on the isolation material and the source and drain permit a read operation. Flow of charge through an underlying sense channel is affected by the presence of charge within the storage channel, thus the presences of charge in the memory can be easily detected.

12 Claims, 3 Drawing Sheets

NONVOLATILE SEMICONDUCTOR MEMORY HAVING THREE DIMENSION CHARGE CONFINEMENT

The United States Government has rights in this invention pursuant to Contract No. DE-AC04-76DP00789 between the Department of Energy and AT&T Technologies, Inc.

BACKGROUND OF THE INVENTION

Nonvolatile semiconductor memories have the property of storing a charge while power is removed from the memory. Prior art devices, conventionally manufactured from silicon, generally have relatively slow write/clear operations because they require charge conduction through insulators, a process that limits lifetimes because of material damage. A typical prior art nonvolatile memory is described in S. M. Sze, *Physics of Semiconductor Devices*, 2nd Ed., John Wiley & Sons, 1981, pg. 496.

F. Capasso et al., "New Floating-Gate AlGaAs/GaAs Memory Devices...", IEEE Electron Device Letters, Vol. 9, No. 8, August 1988, discloses a Type III/V floating gate memory. This memory differs significantly from the invention in that charge is put into and removed from the memory through a vertically displaced gate, rather than through the horizontal edges of a storage cell. Capasso also does not provide protection from ionizing radiation in the manner of the invention.

SUMMARY OF THE INVENTION

It is an object of this invention to provide a nonvolatile memory where charge is controllably confined in a quantum well formed by a double heterojunction.

It is another object of this invention to provide a field effect transistor (FET) acting as a nonvolatile memory element.

It is also an object of this invention to provide a nonvolatile memory FET, controlled through standard FET action, where charge flows only along, never perpendicular to, a channel in the gate region.

Additional objects, advantages, and novel features of the invention will become apparent to those skilled in the art upon examination of the following description or may be learned by practice of the invention. The objects and advantages of the invention may be realized and attained by means of the instrumentalities and combinations particularly pointed out in the appended claims.

To achieve the foregoing and other objects, and in accordance with the purpose of the present invention, as embodied and broadly described herein, the present invention may comprise a nonvolatile semiconductor device comprising a semiconductor substrate; a storage channel; a first barrier layer between the storage channel and the substrate surface; a second barrier layer covering the opposite surface of the storage channel; and isolation means for controllably permitting charge to flow into or out of the boundaries or perimeter of a storage portion of the storage channel, and for retaining charge in the storage portion. In a preferred embodiment of the invention, the isolation means is a Schottky barrier formed by a metal ring in a groove in the second barrier around the perimeter of the storage portion. Application of a voltage to the ring controls the flow of current through the isolation means into and out of the storage channel. The device also may include a sense channel extending under the storage channel between the first barrier layer and the substrate, a gate electrode radially inside and vertically above the storage area, and external electrodes for passing current through the sense channel. The device functions as a field effect transistor (FET), the flow of current through the sense channel being affected by the presence of stored charge in the storage channel. The isolation means is spaced sufficiently from the sense channel to not impede current through the sense channel.

BRIEF DESCRIPTION OF THE DRAWINGS

The accompanying drawings, which are incorporated in and form part of the specification, illustrate an embodiment of the present invention and, together with the description, serve to explain the principles of the invention.

DETAILED DESCRIPTION OF THE INVENTION

The basic concept of this invention is that charge may be confined in a compound semiconductor by a quantum well formed by the different energy band gaps of adjacent layers. This confined charge is also protected from ionizing radiation by additional heterojunctions. The basic storage unit described herein can be used as the central component for nonvolatile memories, charge coupled devices, dynamic RAMs, or any other device that depends on stored charge for operation.

Figure 1:
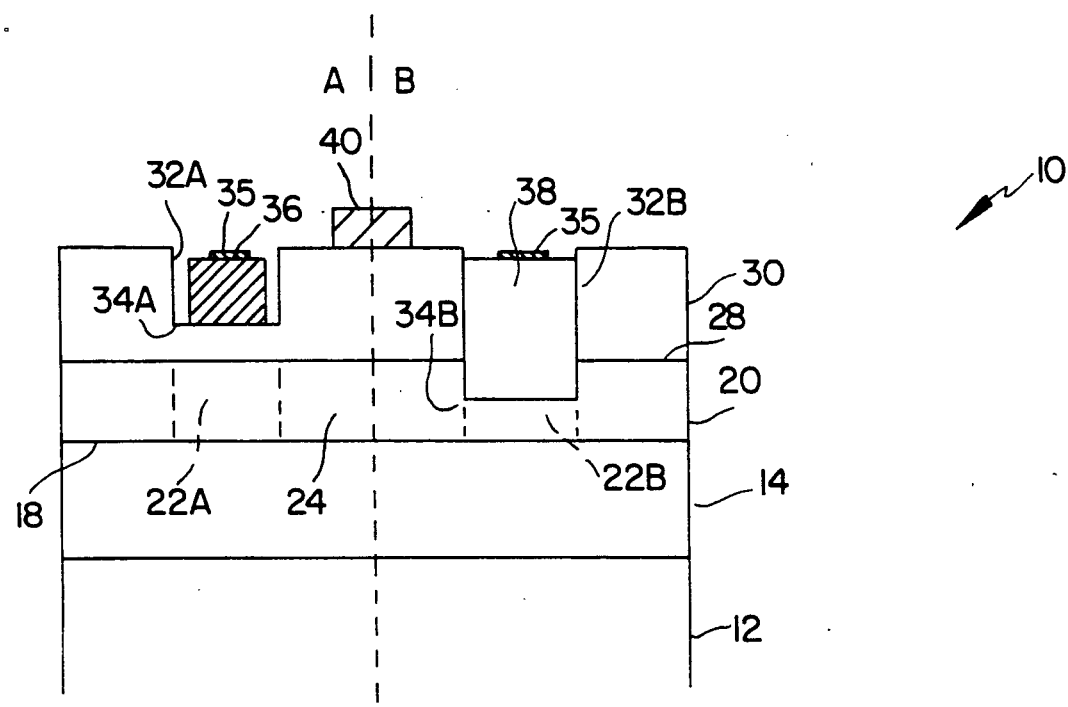
FIG. 1 shows a cross-section of two embodiments of a charge storage cell of the invention.

FIG. 1 shows two embodiments of storage cell 10 to include a compound semiconductor formed on a buffer/substrate 12 including a storage channel 20 having a first surface 18 and a second surface 28, a first barrier layer 14 between buffer/substrate 12 and first surface 18, and a second barrier layer 30 covering second surface 28. The barrier layers 14, 30 are made of materials having a greater energy band gap than the material of storage channel 20. As a result, any charge which enters channel 20 from an edge is confined vertically in the figure to channel 20 in a manner well known in this art.

According to the invention, charge will be placed in channel 20 by any known manner (not shown). To confine charge horizontally in channel 20, perimeter 22 is constructed to electrically "pinch off" the channel and restrain the charge in central storage portion 24. To controllably release the stored charge, an electrical signal is applied to perimeter 22 to cause conduction in channel 20 as discussed hereinafter.

FIG. 1 shows two embodiments of isolation means for closing perimeter 22. Embodiment "A" utilizes a Schottky barrier and is illustrated at the left side of the figure; embodiment "B" utilizes a heterojunction and is shown on the right side. In practice, the construction of either embodiment would be symmetric around the centerline of the figure and would define the boundaries or perimeter of a storage portion 24.

In either embodiment, a groove 32 is cut in second barrier layer around at least a portion of perimeter 22.

For the preferred embodiment "A" (illustrated on the left side of the figure), a metal ring 36 is placed in groove 32A to form a Schottky barrier to "pinch off" channel 20. The depth of the bottom 34A of groove 32A is selected to provide adequate Schottky "pinch off" of channel 20.

An approximate expression for barrier height, $V_p$, along the channel due to the Schottky contact is given by:

$$V_p \approx \phi M - \Delta E_c - qN_D d^2/2\epsilon$$

where $\phi_M$ is the Schottky barrier height, $\Delta E_c$ is the conduction band offset at the wide bandgap barrier 30 and channel 20, $N_D$ and $\epsilon$, respectively, are the doping level and the dielectric constant of the barrier layer 30.

For embodiment "B" (illustrated on the right side of the figure), the bottom 34B of groove 32B is cut into storage channel 20 and groove 32B is filled with a second material to form a heterojunction to confine the charge. Molecular beam epitaxy regrowth techniques exist for separate growths of the layered structure, which structure may be removed from the reactor and etched, followed by additional growth steps. Localized alloy formation produced by selected area diffusion or ion implantation and annealing could also be used to construct this embodiment.

For either embodiment, the storage barriers may be altered for the movement of charge into or out of storage portion 24 by the application of a control voltage to either ring 36 or material 38 through a contact means 35. This voltage changes the Schottky barrier ($\phi_M$) and reduces $V_p$. In addition, a gate contact 40 may be utilized to detect the presence or absence of stored charge in storage portion 24 of storage channel 20 by measuring the capacitance of the device.

For sufficiently thick barrier layers, there are two primary leakage mechanisms which determine the storage time of the invention.

The first mechanism is thermal emission over the quantum well potential of the barrier layer. The relevant rate equation is $$dn_s/dt = n_s/\tau_B,$$

where $$\tau_B = d(2m^*\pi/kT)^{1/2} e(-q\Delta E_c/kT)$$

and $n_s$ is the area density of stored charge, d is the well thickness, and m* is the effective mass of the channel electrons. For storage on the order of one hour at room temperature, a barrier of about 1 volt is needed. A barrier of about 1.25 volts will provide more than 10 years storage time.

The second mechanism is recombination, which is represented by $$dn_s/dt = n_s/\tau_R$$

where $n_s$ is the area density and $\tau_R$ represents the stored carrier lifetime. A semiconductor having the property of spatially separating the energy minimums for electrons and holes is known as a Type II semiconductor. This property increases $\tau_R$ and suggests that such materials would be advantageous for use in the nonvolatile memory of this invention.

Ionization radiation could be a potential problem for quantum well confinement as it can introduce carriers for recombination with the stored charge. This effect may be minimized by placing Type I semiconductor quantum wells (i.e., a semiconductor having the property that energy minima for electrons and holes occur at the same location) above and below the storage channel. The Type I material will trap both holes and electrons created by the ionizing radiation and allow recombination to occur before these photogenerated carriers can drift or diffuse to the storage vicinity.

The storage cell of the invention may be made from many materials able to form a quantum well on the multilayer structure described above. Group III/V semiconductors are especially well suited for use with the invention. In particular, the barrier layers may be AlAs or AlSb, while the storage layer may be GaAs or InAs. In addition, the invention may be formed of combinations of group III/V semiconductors, such as $Ga_x In_{1-c}As$. Deeper wells can be formed with II–VI compounds such as ZnSe grown on GaAs. Schottky barriers above 1 V on n− type GaAs are observed for Pt, and wider bandgap materials should increase this value. Both lattice matched and strained layer systems may be used in the practice of this invention.

For lattice matched structures, typical layer thicknesses would be on the order of 500 Angstroms; in strained layer applications layer thickness would be below 100 Angstroms.

Figure 2:
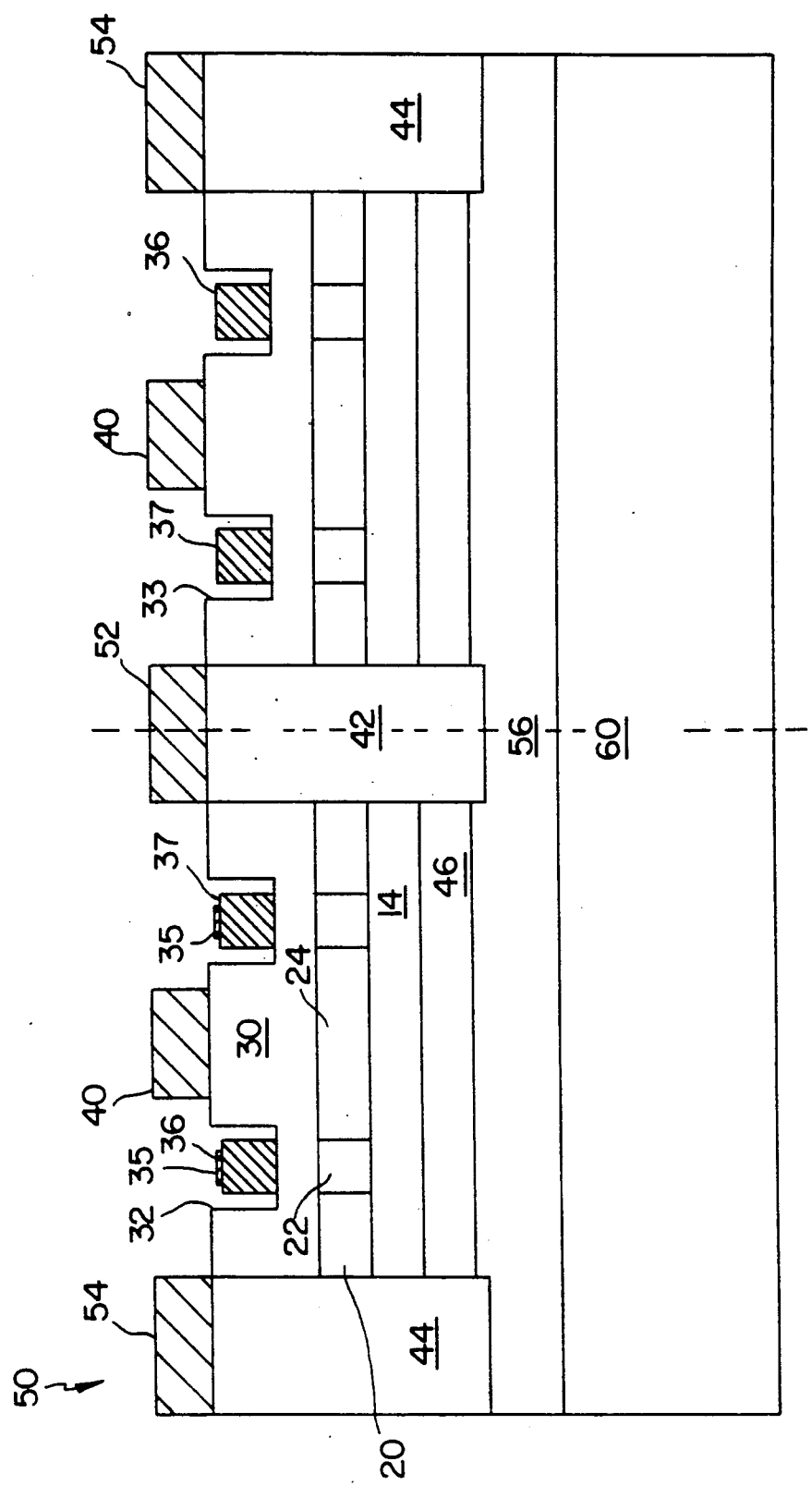
FIG. 2 shows a FET in accordance with the first embodiment of the invention.

The storage cell of this invention may be utilized as part of a MODFET (modulation doped FET) such as FET 50 shown in FIG. 2. In a preferred embodiment, FET 50 includes a sense channel 46 for carrying current between sense contact means such as conventional spaced source electrode 42 and drain electrode 44. An external current source is connected to sense channel 46 through Ohmic drain contacts 52, 54. The flow of current through sense channel 46 is regulated by the application of an external voltage to a control gate, preferably gate 40 of the storage cell, in a manner well known to those skilled in this art. The sense channel is spaced a sufficient distance from the isolation means so that the isolation means do not control the flow of charge through the sense channel.

FET 50 differs from a conventional FET described above with the addition of storage cell 10. In particular, storage channel 20 extends between two spaced storage contact means, preferably source 42 and drain 44. Channel 20 is spaced from sense channel 46 by first barrier layer 14, and spaced from gate 40 by second barrier layer 30. Isolation ring 36, in groove 32, serves to control current flow between storage portion 24 and drain 44, while isolation ring 37, in groove 33, serves to control current flow between storage portion 24 and source 42. Sense channel 46 may be grown directly upon buffer/substrate 60, or separated therefrom by a third barrier layer 56.

FET 50 is shown to be symmetrical about a centerline passing through the center of source 42. Each of grooves 32, 33, gate 40, and drain 54 may define the storage cell 10 as a square, circle, rectangle, or other closed shape. Preferably, each of these items is concentric with the other items around source 42.

Figure 3:
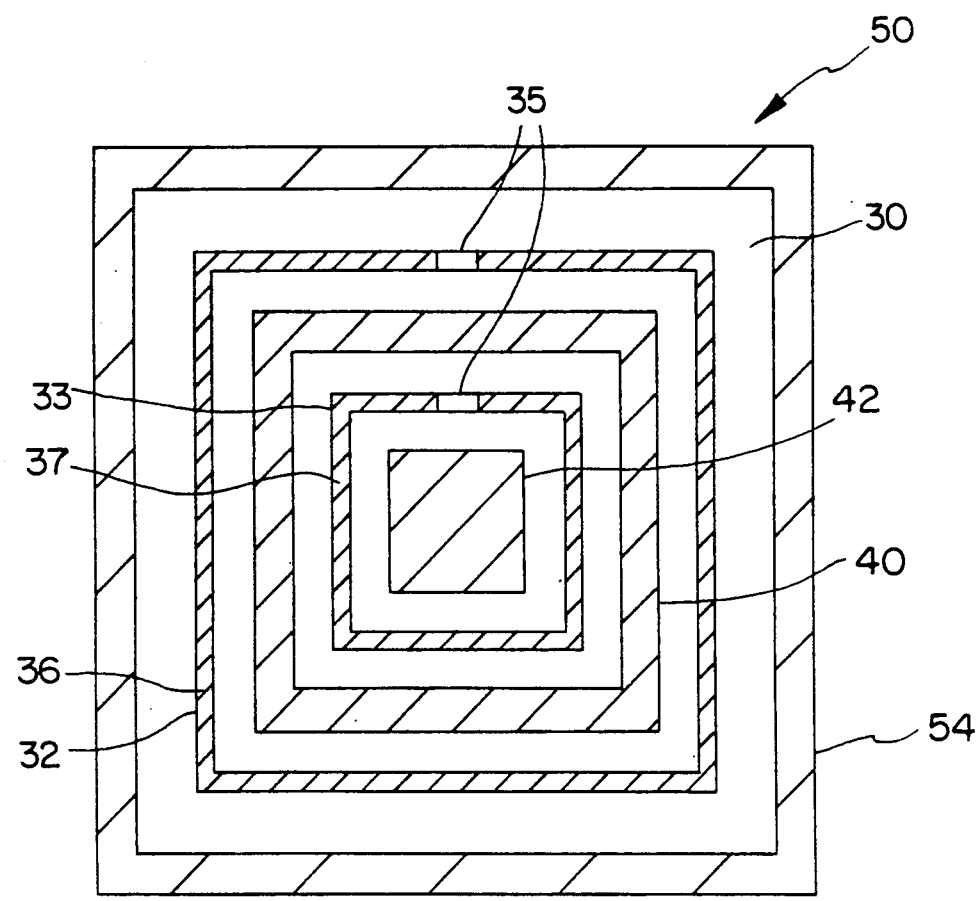
FIG. 3 is a top view of the invention.

FIG. 3 illustrates a rectangular version of FET 50 when viewed from the top and illustrates the appearance of the invention when rotated about the center of the source 42 as shown in FIG. 2. The layers underlying the second barrier layer 30 which comprise the storage channel 20, the first barrier layer 14, the sense channel 46, a third barrier layer 56 and buffer/substrate 60 cannot be seen. Illustrated as extending from the center is the source 42, isolation ring 36 in groove 32, gate 40, isolation ring 37 in groove 33 and drain 54 with the second barrier layer 30 interposed between each of the above elements.

In operation, Schottky isolation rings 36, 37 are spaced sufficiently close to storage channel 20 to be able to electrically close portions 22, restraining charge in channel 20 to doughnut-shaped storage portion 24 when power is removed from FET 50. The store operation (write) is accomplished by raising the voltage on both isolation rings and connecting source 42, drain 44, and gate 40 to a common (high) potential. Charge is cleared from storage portion 24 (clear) by raising the potential of only isolation ring 36 next to drain 44, which electrode is connected to high potential while gate 40 is grounded.

The presence or absence of stored charge in storage portion 24 is sensed by measuring either the threshold voltage of FET 50 or the current through sense channel 46. For example, the simplest operation occurs for transistor parameters chosen such that the area of sense channel 46 under the storage portion 24 is "pinched off" when charge is stored, a condition which occurs when the voltage, $\Delta V$, due to stored charge $$\Delta V = (d/\epsilon) n_s$$

is approximately equal to the conduction band offset for sense channel 46. When this condition is met, connecting the source and gate to ground and the drain to a supply voltage will result in current flow from source to drain with no charge stored, and no current flow with charge in storage portion 24, independent of gate voltage.

FET 50 may preferably be epitaxially grown from the Group III/V materials discussed above.

The particular sizes and materials discussed above are cited merely to illustrate a particular embodiment of this invention. It is contemplated that the use of the invention may involve components having different sizes and shapes as long as the principle of edge confinement of charge in a storage channel is followed. It is intended that the scope of the invention be defined by the claims appended hereto.

We claim:

1. A nonvolatile memory semiconductor device comprising:
   (a) a substrate;
   (b) a first barrier layer covering said substrate;
   (c) a sense channel covering said first barrier layer;
   (d) a second barrier layer covering said sense channel;
   (e) a storage channel covering said second barrier layer;
   (f) a third barrier layer covering said storage channel;
   (g) a storage contact means for allowing charge to laterally flow through said storage channel, said contact means defining a horizontal boundary of said storage channel;
   (h) a storage portion, within said storage channel, whose inner and outer horizontal boundaries are defined by a confining means, and whose upper and lower vertical boundaries are defined by said second and third barrier layers; and
   (i) a confining means situated in said third barrier layer for retaining charge in said storage portion, where said retained charge is sensed by said sense channel.

2. The nonvolatile memory semiconductor device of claim 1 wherein said barrier layers, storage channel, and substrate consist of Group II/V semiconductors.

3. The nonvolatile memory semiconductor device of claim 1, said confining means further comprising:
   (a) a plurality of grooves within said third barrier;
   (b) an isolation means within said grooves; and
   (c) an isolation contact means connected to said isolation material wherein the application of voltage to said isolation means through said isolation contact means controls said confining means.

4. The nonvolatile memory semiconductor device of claim 3 wherein said isolation means is provided by a controllable Schottky barrier.

5. The nonvolatile memory semiconductor device of claim 3 wherein said isolation means is a semiconductor material forming a heterojunction with said storage channel.

6. The nonvolatile memory semiconductor device of claim 4 or 5, further comprising:
   a sense channel contact means comprising a source and a drain, both source and drain electrically connected to said sense channel, said sense channel contact means allowing charge to laterally flow through said sense channel, said charge flow through said sense channel being affected by the presence of said retaining charge in said storage portion; and
   said sense channel is vertically spaced a sufficient distance from said confining means so that said isolation means does not affect the flow of charge through said sense channel.

7. The nonvolatile memory semiconductor device of claim 6, further comprising:
   a gate contact means located vertically above said storage portion, said gate contact means to electrically cooperate with said storage contact means and said isolation contact means for controllably permitting charge to laterally flow through said storage channel, wherein said device is a field effect transistor.

8. The nonvolatile memory semiconductor device of claim 7 wherein said channels consist of GaAs.

9. The nonvolatile memory semiconductor device of claim 7 wherein said channels consist of InAs.

10. The nonvolatile memory semiconductor device of claim 7 wherein said gate contact means is an alternate sensing means for detecting the presence of a charge within said storage portion of said storage channel by capacitance measurement of said storage portion through said gate contact means.

11. The nonvolatile memory semiconductor device of claim 7 wherein said sense channel contact means and said storage contact means are the same contacts.

12. The nonvolatile memory semiconductor device of claim 11 wherein:
   said storage contact means and sense channel contact means further comprise two ohmic contact regions, one of said ohmic contact regions surrounding the other ohmic contact region;
   said gate contact means is intermediate between said ohmic contact regions; and
   one of said grooves is intermediate between said gate contact means and one of said ohmic contact means, and another of said grooves is intermediate between said gate contact means and the other of said ohmic contact regions.

* * * * *